US011082547B2

(12) United States Patent
Xu et al.

(10) Patent No.: US 11,082,547 B2
(45) Date of Patent: Aug. 3, 2021

(54) TERMINAL PROVIDED WITH CAMERA AND SHOOTING METHOD

(71) Applicant: Huawei Technologies Co., Ltd., Shenzhen (CN)

(72) Inventors: Gang Xu, Shenzhen (CN); Tuo Sun, Shenzhen (CN); Hung-yuan Jau, Shenzhen (CN); Chiaching Chu, Dongguan (CN); Kangchung Liu, Shanghai (CN); Hsienchang Hou, Shenzhen (CN); Xin Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 18 days.

(21) Appl. No.: 16/629,237

(22) PCT Filed: Jul. 7, 2017

(86) PCT No.: PCT/CN2017/092250
§ 371 (c)(1),
(2) Date: Jan. 7, 2020

(87) PCT Pub. No.: WO2019/006749
PCT Pub. Date: Jan. 10, 2019

(65) Prior Publication Data
US 2020/0195764 A1    Jun. 18, 2020

(51) Int. Cl.
*H04N 5/225*   (2006.01)
*H04M 1/02*    (2006.01)
*H05K 5/00*    (2006.01)

(52) U.S. Cl.
CPC ........ *H04M 1/0264* (2013.01); *H04N 5/2257* (2013.01); *H05K 5/0017* (2013.01)

(58) Field of Classification Search
CPC ........... H04M 1/0264; H04M 2250/52; H04M 1/0266; H04M 1/724; H04N 5/2259;
(Continued)

(56) References Cited

U.S. PATENT DOCUMENTS 5,646,679 A    7/1997  Yano et al.
2004/0263670 A1    12/2004  Yamasaki
(Continued)

FOREIGN PATENT DOCUMENTS

CN    1627811 A    6/2005
CN    104021759 A    9/2014
(Continued)

*Primary Examiner* — Mekonnen D Dagnew
(74) *Attorney, Agent, or Firm* — Conley Rose, P.C.

(57) ABSTRACT

A terminal, comprising at least two front cameras located behind a display panel, wherein an area corresponding to a position of the at least one camera on the display panel is a first area, and other than the first area on the display panel is a second area, wherein each pixel unit of the first area and the second area respectively comprises a transparent portion and a non-transparent portion and a proportion of the transparent portion in the first area is greater than that of the second area. The terminal further comprises a processor configured to obtain N pictures taken by the at least two cameras, and process the N pictures by complementing the occluded areas based on pictures taken by the at least two cameras to obtain a picture in which the occluded area is completely or partially recovered.

20 Claims, 12 Drawing Sheets

(58) Field of Classification Search
CPC .... H04N 5/2257; H04N 5/247; H04N 5/2253; H04N 5/2258; H05K 5/0017; H01L 27/326

See application file for complete search history.

(56) References Cited

U.S. PATENT DOCUMENTS

| | | |
|---|---|---|
| 2005/0128332 A1 | 6/2005 | Tsuboi |
| 2011/0285891 A1 | 11/2011 | Maglaque |
| 2011/0298953 A1 | 12/2011 | Makamura |
| 2012/0162490 A1 | 6/2012 | Chung et al. |
| 2013/0135328 A1* | 5/2013 | Rappoport ............ G06F 3/0481 345/522 |
| 2013/0207952 A1 | 8/2013 | Yu |
| 2016/0267838 A1 | 9/2016 | Zhang et al. |
| 2017/0070679 A1* | 3/2017 | Chung .................. H04N 7/142 |
| 2017/0084231 A1 | 3/2017 | Chew |
| 2018/0210493 A1 | 7/2018 | Bao |
| 2018/0324286 A1* | 11/2018 | Cheng .................. H04N 5/2351 |
| 2019/0096310 A1* | 3/2019 | Chen .................... G09G 3/2003 |

FOREIGN PATENT DOCUMENTS

| | | |
|---|---|---|
| CN | 104079811 A | 10/2014 |
| CN | 104580882 A | 4/2015 |
| CN | 105208255 A | 12/2015 |
| CN | 106603772 A | 4/2017 |
| CN | 106920470 A | 7/2017 |
| CN | 106921767 A | 7/2017 |
| EP | 2469852 A1 | 6/2012 |
| EP | 3139411 A1 | 3/2017 |
| JP | H0818857 B2 | 2/1996 |
| JP | 2005010407 A | 1/2005 |
| JP | 2011259090 A | 12/2011 |
| KR | 20120071963 A | 7/2012 |
| KR | 20170029041 A | 3/2017 |

* cited by examiner

TERMINAL PROVIDED WITH CAMERA AND SHOOTING METHOD

CROSS-REFERENCE TO RELATED APPLICATIONS

This application is a national stage application of International Patent Application No. PCT/CN2017/092250, filed on Jul. 7, 2017, which is hereby incorporated by reference in its entirety.

TECHNICAL FIELD

This application relates to the field of terminal technologies, and in particular, to a terminal provided with a camera and a shooting method.

BACKGROUND

As the market demands increasingly higher screen-to-body ratios of mobile phones, major manufacturers have all launched full-screen concept terminal devices, for example, Xiaomi MIX and Sharp Aquos Crystal. Currently, a goal of terminal device development is to deliver terminals with a front panel full of a screen.

At present, solutions are already available to transfer or integrate, for example, a fingerprint/return function Home button into a screen. However, for a front-facing camera, there is no desirable solution to integrate the camera with a display area of a screen. One way envisioned is to perform abnormity cutting on a screen to cut off a portion of the screen, and use room made by the screen cutting to install components such as a camera.

However, if the front-facing camera is integrated with the screen in this way, the cut-off portion becomes unable to display anything. When the screen is lit, a dark corner or groove appears. This is a non-ideal industrial design (industrial design, ID) effect, affecting overall display of the screen and adding to costs of a display panel.

SUMMARY

Embodiments of this application provide a terminal provided with a camera and a shooting method, to integrate a front-facing camera into a display area without affecting an industrial design effect and overall display of a screen.

A first aspect of the embodiments of this application provides a terminal provided with a camera, including: a processor, a memory, a display panel, and at least one camera, where the at least one camera is located behind the display panel, an area corresponding to a position of the at least one camera on the display panel is a first area, and an area other than the first area on the display panel is a second area, where each pixel unit of the first area includes a transparent portion and a non-transparent portion, each pixel unit of the second area includes the transparent portion and the non-transparent portion, and a proportion of the transparent portion in the first area is greater than a proportion of the transparent portion in the second area.

In a possible design, in a first implementation of the first aspect of the embodiments of this application, the transparent portion is transparent glass or a transparent plastic film, and the non-transparent portion includes a portion disposed in the pixel unit and provided with a thin film transistor device and a metal wire. In this implementation, compositions of the transparent portion and the non-transparent portion are detailed. In this way, the embodiments of this application are more operable.

In a possible design, in a second implementation of the first aspect of the embodiments of this application, the terminal further includes a micro-motor and the micro-motor includes a housing.

In a possible design, the terminal further includes a micro-motor and there is at least one camera, where the micro-motor is physically connected to the camera, and is configured to drive the at least one camera to move.

In a possible design, in a third implementation of the first aspect of the embodiments of this application, a quantity of pixels per inch PPI of the first area is 1/M of a PPI of the second area, where M is greater than 1. In this implementation, the PPI of the first area is 1/M of the PPI of the second area, where M is greater than 1. In this way, the transparent proportion of the first area is greater than the transparent proportion of the second area, adding to implementations of the embodiments of this application.

In a possible design, in a fourth implementation of the first aspect of the embodiments of this application, a pixel circuit without internal compensation is used in the first area, and a pixel circuit with internal compensation is used in the second area. In this implementation, use of the pixel circuit without internal compensation is detailed to increase the transparent proportion, adding to implementations of the embodiments of this application.

A second aspect of the embodiments of this application provides a shooting method applicable to a terminal provided with a camera. The terminal includes a display panel and at least one camera, where the at least one camera is located behind the display panel, an area corresponding to a position of the at least one camera on the display panel is a first area, and an area other than the first area on the display panel is a second area, where each pixel unit of the first area includes a transparent portion and a non-transparent portion, each pixel unit of the second area includes the transparent portion and the non-transparent portion, and a proportion of the transparent portion in the first area is greater than a proportion of the transparent portion in the second area. The shooting method includes: obtaining N pictures quickly taken by the camera at different positions relative to the display panel, where, in each of the N pictures, there is an occluded area resulting from occlusion by the non-transparent portion in the first area, and N is a positive integer greater than 1; and processing the N pictures by using an image synthesis method, to obtain a picture in which the occluded area is completely or partially recovered.

In a possible design, in a first implementation of the second aspect of the embodiments of this application, the terminal further includes a micro-motor, where the micro-motor is physically connected to the camera to drive the at least one camera to move. The obtaining N pictures quickly taken by the camera at different positions relative to the display panel includes: driving, by the micro-motor, the at least one camera to move during shooting; and during movement of the at least one camera, controlling the at least one camera to quickly take the N pictures at different positions relative to the display panel. The processing the N pictures by using an image synthesis method includes: processing the N pictures based on positions of the camera relative to the display panel when the at least one camera moves. In this implementation, a plurality of pictures may be taken for processing, by moving the at least one camera of the terminal. In this way, a detailed operation mode of the embodiments of this application is provided.

In a possible design, in a second implementation of the second aspect of the embodiments of this application, there are at least two cameras. The processing the N pictures by using an image synthesis method includes: processing the N pictures by complementing the occluded area based on pictures taken by the at least two cameras. In this implementation, when the terminal is provided with at least two cameras, the N pictures are processed by complementing the pictures taken by the cameras. In this way, the embodiments of this application are more operable.

In a possible design, in a third implementation of the second aspect of the embodiments of this application, when the picture in which the occluded area is partially recovered is obtained, the method further includes: processing, by using an image processing algorithm, the picture in which the occluded area is partially recovered, to obtain a picture in which the occluded area is completely recovered. In this implementation, the occluded area can be recovered by using the image processing algorithm, adding to implementations of the embodiments of this application.

In a possible design, in a fourth implementation of the second aspect of the embodiments of this application, the processing, by using an image processing algorithm, the picture in which the occluded area is partially recovered includes: performing an interpolation operation on an occluded pixel in the picture in which the occluded area is partially recovered, by using information of adjacent pixels of the occluded pixel. In this implementation, the interpolation operation is performed by using the information of the adjacent pixels to recover the occluded area. In this way, the embodiments of this application are finer and more operable.

In a possible design, in a fifth implementation of the second aspect of the embodiments of this application, the processing, by using an image processing algorithm, the picture in which the occluded area is partially recovered includes: recognizing physical information of an occluded pixel in the picture in which the occluded area is partially recovered; and recovering information of the occluded pixel in the picture in which the occluded area is partially recovered, based on content of the recognized physical information. In this implementation, the occluded area is recovered based on the physical information, adding to implementations of the embodiments of this application.

In a possible design, in a sixth implementation of the second aspect of the embodiments of this application, a PPI of the first area is 1/M of a PPI of the second area, where M is greater than 1, and the method further includes: compressing display data of M adjacent pixels in the first area into display data of one pixel for display. In this implementation, after the PPI is reduced, the display data of the first area is compressed to ensure a display effect.

In a possible design, in a seventh implementation of the second aspect of the embodiments of this application, the method further includes: increasing overall brightness of the first area so that a similarity between brightness curves of the first area and the second area is greater than a preset value. In this implementation, after the PPI is reduced, a proportion of a light emitting pixel area becomes smaller. Therefore, brightness needs to be enhanced to ensure a display effect.

In a possible design, in an eighth implementation of the second aspect of the embodiments of this application, a pixel circuit without internal compensation is used in the first area, and the method further includes: performing external compensation on the pixel units of the first area. In this implementation, when the pixel circuit without internal compensation is used in the first area, external compensation needs to be performed to eliminate chromatic aberration.

In a possible design, in a ninth implementation of the second aspect of the embodiments of this application, the method further includes: inserting a black frame into the display panel during shooting. In this implementation, the black frame is inserted into the display panel to avoid interference of light emitted by the display panel in front of the camera.

In a possible design, in a tenth implementation of the second aspect of the embodiments of this application, the inserting a black frame into the display panel during shooting includes: starting a black frame insertion operation when a shooting instruction is received; starting shooting when it is determined that the black frame insertion operation is completed; and recovering a screen when a shooting completion instruction is received. In this implementation, timing for adding the black frame is detailed. In this way, the embodiments of this application are more operable.

In a possible design, in an eleventh implementation of the second aspect of the embodiments of this application, the black frame is a full-screen black frame, or a black frame that turns the first area into a black screen. In this implementation, it is detailed that the black frame may be full-screen or used only in the first area, adding to implementations of the embodiments of this application.

A third aspect of the embodiments of this application provides a computer readable storage medium, including an instruction, where, when the computer readable storage medium is run on a computer, the computer is enabled to perform the method according to the foregoing aspects.

A fourth aspect of the embodiments of this application provides a computer program product including an instruction, where, when the computer program product is run on a computer, the computer is enabled to perform the method according to the foregoing aspects.

In the technical solutions provided by the embodiments of this application, the embodiments of this application include: placing a camera behind a pixel area of a screen, where an area in front of the camera is a first area of the pixel area of the display screen. In the embodiments of this application, the camera is located behind the pixel area of the screen to ensure integrity and normal display of the screen, and the first area in front of the camera has a transparent portion, to ensure normal shooting by the camera. In this way, integration of a front-facing camera into a display area is implemented without affecting an industrial design effect and overall display of the screen.

DETAILED DESCRIPTION OF THE EMBODIMENTS

The following clearly and completely describes the technical solutions in the embodiments of this application with reference to the accompanying drawings in the embodiments of this application. Apparently, the described embodiments are only some but not all of the embodiments of this application. All other embodiments obtained by a person skilled in the art based on the embodiments of this application without creative efforts shall fall within the protection scope of this application.

In the prior art, a camera may be integrated into a display area to achieve full-screen effect. However, this effect is achieved by cutting off a portion of a screen to make room for a camera module. As a result, an area in which the camera module is placed is unable to display anything, and when the screen is lit, a dark corner appears. This is a non-ideal industrial design effect, affecting overall display of the screen.

In the technical solutions of this application, a terminal is user equipment provided with a display panel and a front-facing camera. The terminal differs from a conventional terminal mainly in that the front-facing camera is placed behind the display panel.

Figure 1:
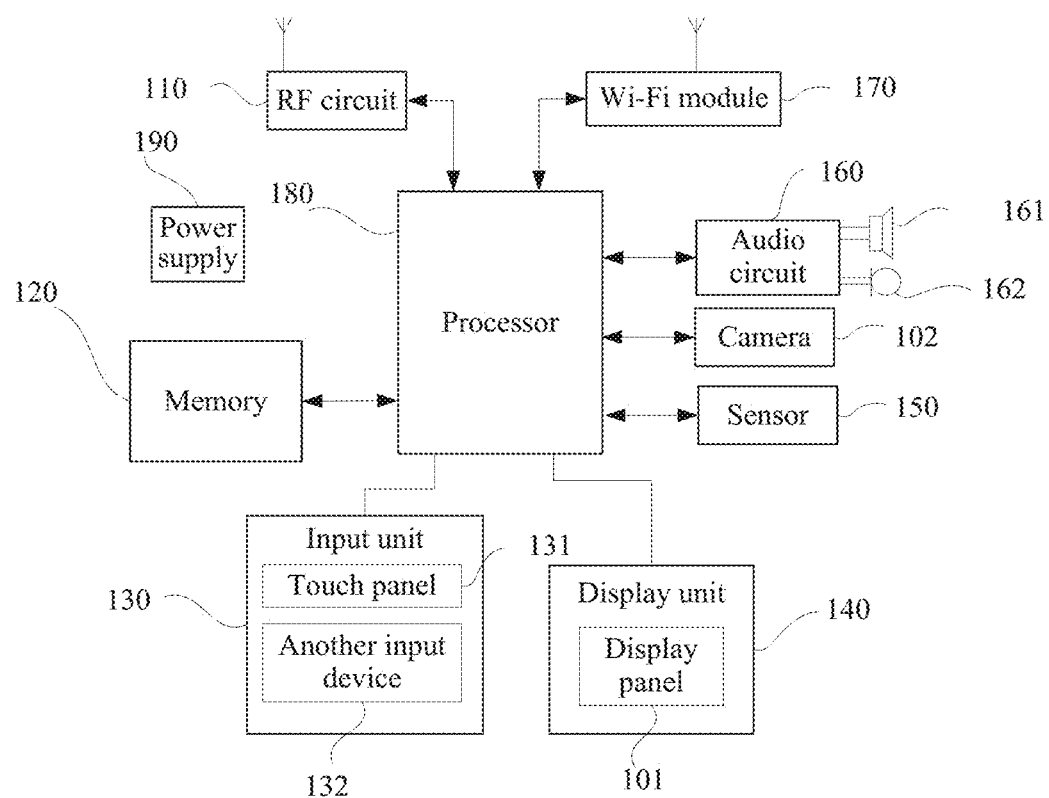
FIG. 1 is a block diagram of a partial structure of a terminal provided with a camera according to an embodiment of this application.

FIG. 1 is a block diagram of a partial structure of a terminal according to an embodiment of this application.

The terminal includes a display panel 101 and at least one camera 102.

The terminal may further include a processor 180, a memory 120, a wireless fidelity (wireless fidelity, Wi-Fi) module 170, a radio frequency (radio frequency, RF) circuit 110, an input unit 131, a display unit 140, an audio circuit 160, a sensor 150, and the like. A person skilled in the art may understand that the terminal structure shown in FIG. 1 constitutes no limitation on the terminal. The terminal may include more or fewer components than those shown in FIG. 1, a combination of some components, or a different component arrangement.

The display unit 140 may be configured to display an image. The display unit 140 includes the display panel 101. Further, a touch panel 131 may cover the display panel 101. After detecting a touch operation on or near the touch panel 131, the touch panel 131 transmits the touch operation to the processor 180 to determine a touch event type, and then the processor 180 provides corresponding visual output on the display panel 101 based on the touch event type. Although the touch panel 131 and the display panel 101 in FIG. 1 are shown as two separate components to implement input and output functions of the terminal, in some embodiments, the touch panel 131 may be integrated with the display panel 101 to implement the input and output functions of the terminal.

The input unit 130 may be configured for a user to, for example, select a target application and make feedback according to prompt information, on a setting interface. Specifically, the input unit 130 may include the touch panel 131 and another input device 132. The touch panel 131, also referred to as a touchscreen, may collect the touch operation performed by the user on or near the touch panel 131. Optionally, the touch panel 131 may include two components: a touch detection apparatus and a touch controller. The touch detection apparatus detects a touch position of the user, detects a signal brought by a touch operation, and transmits the signal to the touch controller. The touch controller receives touch information from the touch detection apparatus, converts the touch information into coordinates of a touch point, sends the coordinates to the processor 180, and can receive and execute a command sent by the processor 180. In addition, the touch panel 131 may be implemented in a plurality of types such as a resistor type, a capacitor type, an infrared type, and a surface acoustic wave type. The input unit 130 may further include another input device 132, in addition to the touch panel 131. Specifically, the another input device 132 may include but is not limited to one or more of a physical keyboard, a function button (such as a volume control button or a power button), a trackball, a mouse, and a joystick.

Wi-Fi is a short-range radio transmission technology. The terminal may use the Wi-Fi module 170 to, for example, send/receive an e-mail, browse a web page, and access streaming media, thereby providing wireless broadband internet access.

The RF circuit 110 is connected to the processor 180 by a bus. The RF circuit 110 is responsible for sending data to the internet or receiving data from the internet, and may also be configured to receive/send information, or receive/send a signal during a call. Particularly, after receiving downlink information of a base station, the RF circuit 110 sends the downlink information to the processor 180 for processing. In addition, the RF circuit 110 sends data related to uplink transmission to the base station. Generally, the RF circuit 110 includes but is not limited to an antenna, at least one amplifier, a transceiver, a coupler, a low noise amplifier (low noise amplifier, LNA), and a duplexer. In addition, the RF circuit 110 may also communicate with a network and another device through wireless communication. The wireless communication may use any communication standard or protocol, including but not limited to global system for mobile communications (global system for mobile communications, GSM), general packet radio service (general packet radio service, GPRS), code division multiple access (code division multiple access, CDMA), wideband code division multiple access wideband code division multiple access, WCDMA), long term evolution (long term evolution, LTE), email, and short messaging service (short messaging service, SMS).

The memory 120 may be configured to store a software program and a module. The processor 180 runs the software program and the module stored in the memory 120 to execute functional applications and data processing of the terminal. The memory 120 may mainly include a program storage area and a data storage area. The program storage area may store an operating system, an application program for at least one function (for example, a sound playing function and an image playing function), and the like. The data storage area may store data (for example, audio data and a phone book) created according to use of the mobile terminal, and the like. In addition, the memory 120 may include a high-speed random access memory, and may further include a non-volatile memory, for example, at least one magnetic disk storage device, flash memory device, or another volatile solid-state memory device.

Figure 2:
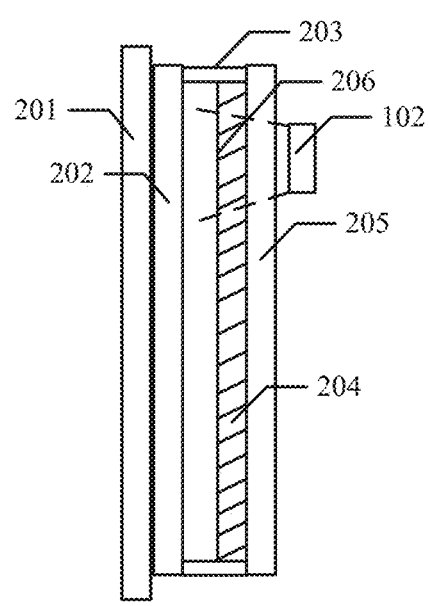
FIG. 2 is a schematic diagram of a position relationship between a display panel and a camera in a terminal according to an embodiment of this application.

In the embodiments of this application, the camera 102 is located behind the display panel 101. To understand this, refer to a position relationship between a display panel and a camera shown in FIG. 2.

The display panel may include a glass cover plate 201, encapsulated glass 202, a sealant 203, a pixel area 204, and thin film transistor glass 205.

Pixel units are arranged in the pixel area 204 for image display.

Thin film transistors are integrated in the thin film transistor glass 205 to drive the pixel units in the pixel area 204.

An area in front of the camera is a first area 206 of the pixel area 204 of the display panel, and each pixel unit of the first area 206 includes a transparent portion and a non-transparent portion. An area other than the first area 206 is a second area, and each pixel unit of the second area also includes a transparent portion and a non-transparent portion. A proportion of the transparent portion in the first area is greater than a proportion of the transparent portion in the second area. To understand this, refer to pixel unit arrangement in the pixel area 204 shown in FIG. 3.

Figure 3:
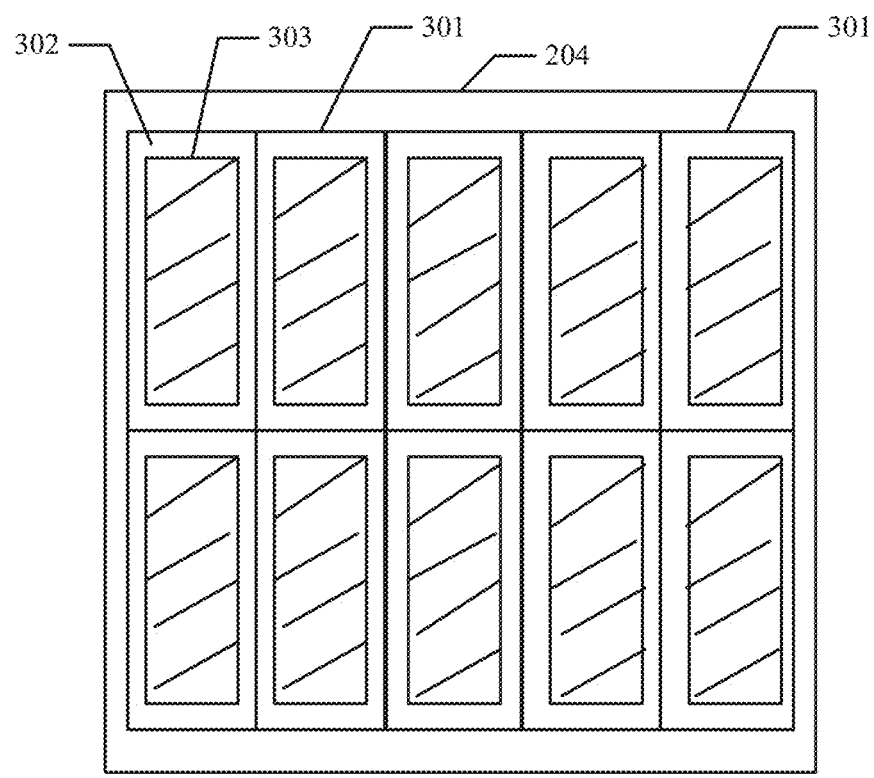
FIG. 3 is a schematic diagram of pixel unit arrangement in a pixel area according to an embodiment of this application.

FIG. 3 is a schematic diagram of pixel unit arrangement in the pixel area 204. Those uniformly arranged are all pixel units 301, where each pixel unit 301 includes a transparent portion 302 and a non-transparent portion 303. The transparent portion 302 is transparent glass or a transparent plastic film, and the non-transparent portion 303 includes a portion disposed in the pixel unit 301 and provided with a thin film transistor device and a metal wire. The camera 102 may take a picture of an external scene through these transparent portions.

It should be noted that FIG. 3 is merely a schematic diagram of pixel unit arrangement in the pixel area 204, and does not limit a specific manner of pixel unit arrangement in the pixel area 204 or a size and a shape of each pixel unit. The pixel units may be arranged in a common RGB arrangement manner, an RGBB arrangement manner, a PenTile arrangement manner, or another arrangement manner. This is not limited herein.

It can be understood that the display panel needs only to have the foregoing transparent portions. Optionally, the display panel 101 may be configured using an organic light-emitting diode (organic light-emitting diode, OLED) technology, a micro light-emitting diode (micro light-emitting diode, MICRO LED) technology, an active-matrix organic light-emitting diode (active-matrix organic light emitting diode, AMOLED) technology, or the like. This is not limited herein.

In this embodiment of this application, the camera 102 is placed behind the display panel 101 to ensure integrity and normal display of the screen. The area in front of the camera 102 is the first area of the pixel area 204 of the display panel 101. The first area has the transparent portions, ensuring normal shooting of the camera 102 and implementing integration of a camera into a display area without affecting an industrial design effect and overall display of the screen.

It can be understood that a polarizer is mounted onto a surface of the display panel, and the polarizer on the surface of the display panel has a function of limiting light reflected by the polarizer. The non-transparent portion functions like a louver to block the camera. A contour of the camera is invisible through the display panel. Moreover, the camera is placed inside the terminal, and it is rather dark inside the terminal. Because the camera is hidden from the user, the industrial design effect is not affected.

Figure 4:
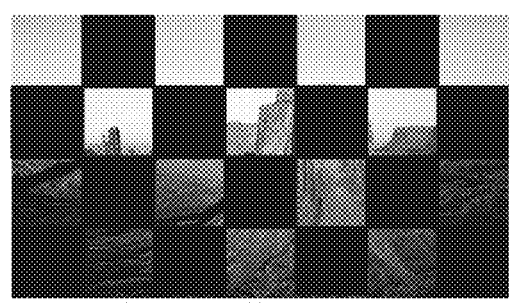
FIG. 4 is a schematic diagram of a result of original picture taking according to an embodiment of this application.

Further, the first area in front of the camera 102 has not only a transparent portion but also a non-transparent portion, and the non-transparent portion occludes shooting of the camera 102. Therefore, an original picture taken may be like that shown in FIG. 4, including alternately spaced occluded areas. Then, the terminal may process the original picture taken to obtain a recovered picture. A plurality of specific processing methods may be used, some of which are selected for description below.

A first processing method is picture synthesis.

Optionally, the processor 180 may call an operation instruction stored in the memory 120 to perform the following operations:

when calling the camera 102 for shooting, instructing the camera 102 to quickly take N pictures at different positions, where, in each of the pictures, there is an occluded area resulting from occlusion by the non-transparent portion, and N is a positive integer greater than 1; and processing the N pictures by using an image synthesis method, to obtain a picture in which the occluded area is recovered.

It can be understood that the occluded areas are not the same in the plurality of pictures taken. For example, an area A is occluded in a first picture, but not occluded in a second picture. Therefore, synthesizing the plurality of pictures can output a picture in which the occluded area is recovered. To understand this, refer to FIG. 5.

Figure 5:
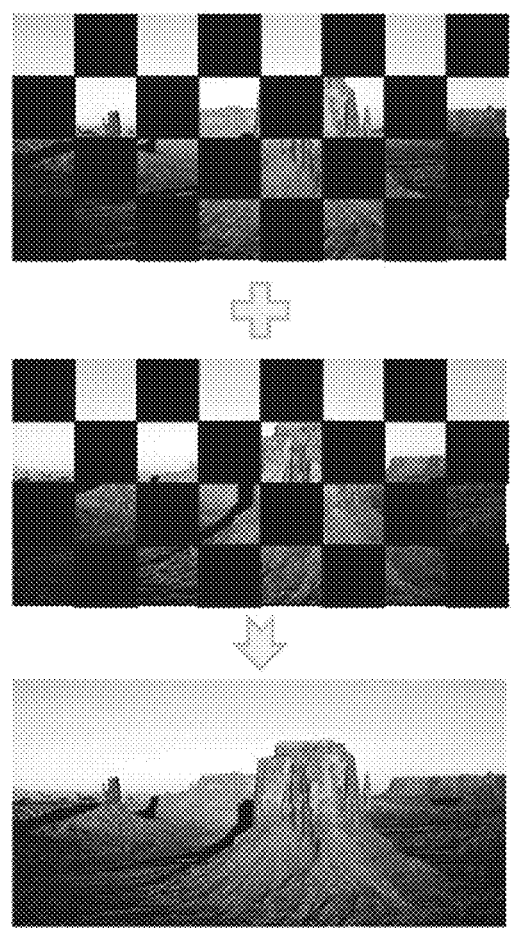
FIG. 5 is a schematic diagram of picture synthesis processing according to an embodiment of this application.

As shown in FIG. 5, both pictures taken have occluded areas, but the occluded areas of the pictures are different. A complete picture in which the occluded area is recovered is obtained after the two pictures are synthesized.

Specifically, there are a plurality of manners to obtain the plurality of pictures with different occluded areas.

Manner 1: The terminal may further include a micro-motor and there is at least one camera 102.

Optionally, when performing the step of instructing the camera 102 to quickly take N pictures at different positions, the processor 180 may specifically perform the following steps:

instructing the micro-motor to drive the at least one camera to move; and during movement of the at least one camera, instructing the at least one camera to quickly take the N pictures at the different positions relative to the screen.

When performing the step of processing the N pictures by using an image synthesis method, the processor 180 may specifically perform the following step:

processing the N pictures based on positions of the camera relative to the display panel when the at least one camera moves.

It can be understood that during shooting, the processor 180 drives, by using the micro-motor, the camera 102 to move, so as to take pictures in different angles during movement. After the shooting is completed, the processor 180 may synthesize the pictures based on positions of the camera 102 relative to the display panel 101 when the camera 102 moves, to obtain a picture in which the occluded area is recovered. To understand this, refer to FIG. 6a and FIG. 6b.

Figure 6A:
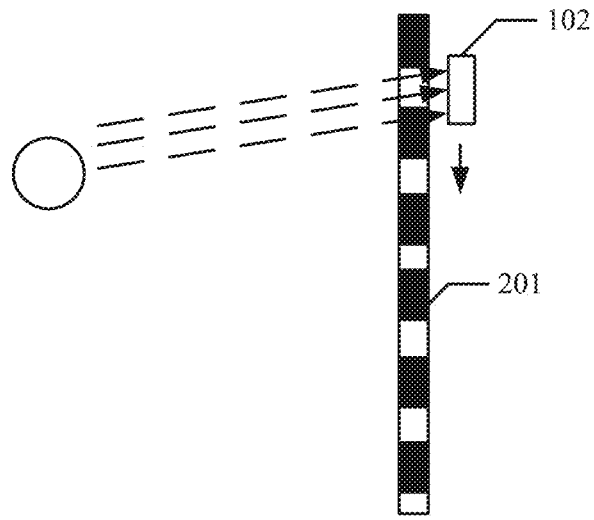
FIG. 6a is a schematic diagram of picture taking by one camera according to an embodiment of this application.
Figure 6B:
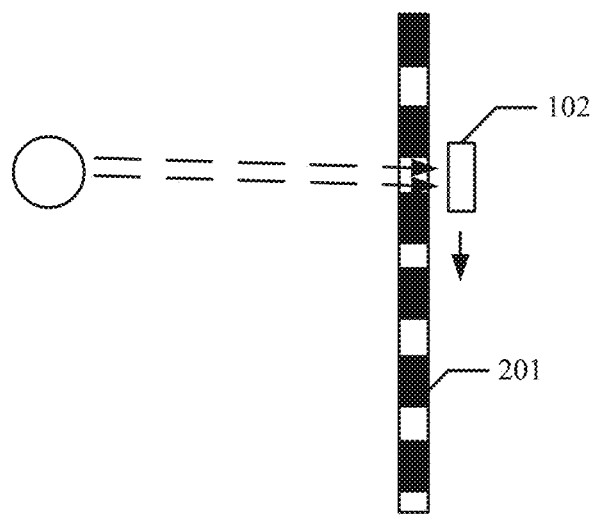
FIG. 6b is another schematic diagram of picture taking by one camera according to an embodiment of this application.

FIG. 6a and FIG. 6b are schematic diagrams of picture taking by one camera during movement. In FIG. 6a, a portion of an object in an original picture taken by the camera is occluded because of occlusion by a non-transparent portion, and the occluded portion is an occluded area. The camera moves under drive of a micro-motor. When a pixel unit is crossed, an area in which an object is occluded in an original picture taken by the camera is different from an occluded area in a picture taken earlier because positions of the camera relative to a real panel are different and shooting angles are different. Therefore, a plurality of pictures with different occluded areas are obtained.

In this way, a picture in which the occluded area is recovered can be obtained by processing a plurality of pictures taken even if there is only one camera.

It should be noted that a structural size of a pixel unit occluding the camera is in tens of micrometers, and therefore by simply pushing the camera to move in a micro distance, a distance equivalent to a half pixel can be crossed, thereby obtaining a plurality of pictures with different occluded areas.

Figure 7:
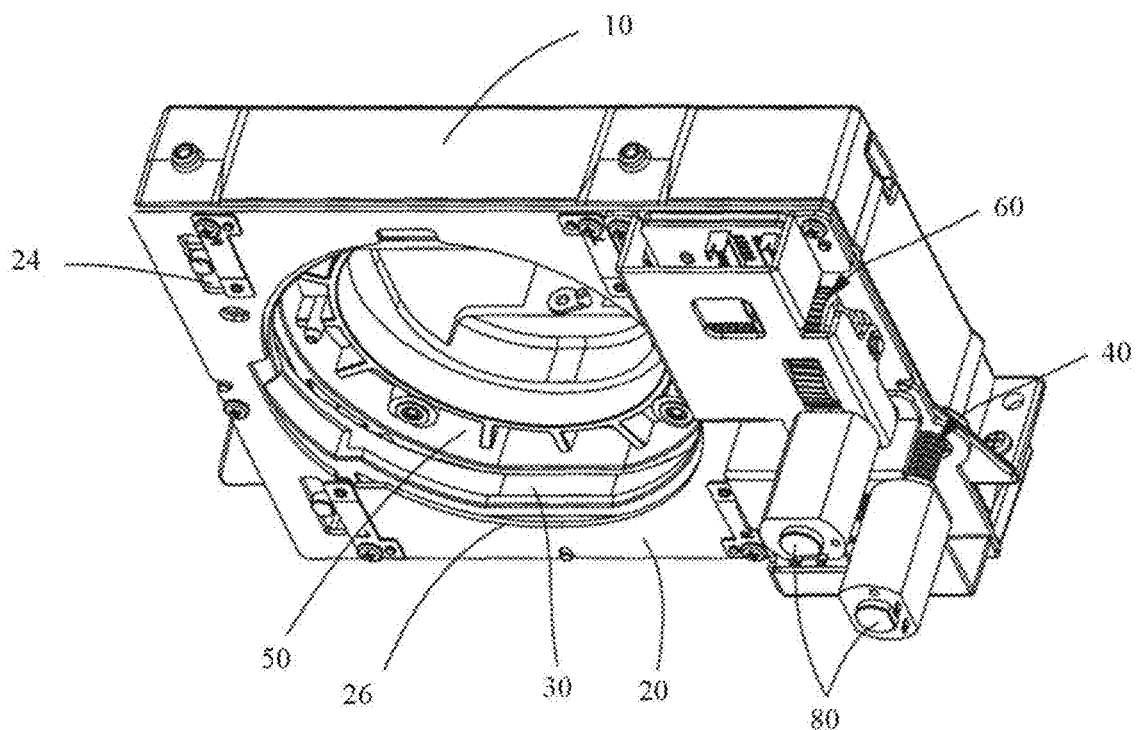
FIG. 7 is a schematic diagram of an adjustment apparatus connecting a micro-motor to a camera according to an embodiment of this application.

It should be noted that the micro-motor that drives the camera to move is a lens driving motor and has a plurality of possible forms. The micro-motor is physically connected to the camera to drive the at least one camera to move in various directions. FIG. 7 shows an example of an adjustment apparatus physically connecting a micro-motor to a camera. The adjustment apparatus includes a housing 10, a vertical slider 30 connected to the camera, a vertical adjustment assembly 40, a horizontal slider 50 connected to the camera, and a horizontal adjustment assembly 60. The horizontal slider 50 and the vertical slider 30 are placed in the hollow housing 10 in turn from a bottom surface of the housing 10; the vertical adjustment assembly 40 is connected to the vertical slider 30; and the horizontal adjustment assembly 60 is connected to the horizontal slider 50. Two micro-motors 80 control the vertical adjustment assembly 40 and the horizontal adjustment assembly 60, respectively. In addition, a cover plate 20 seals the housing 10; a strip-shaped limiting hole 24 is made at a corner of the cover plate 20; and a lens mounting hole 26 adapted to the camera 102 is provided in the center of the cover plate 20.

Figure 8:
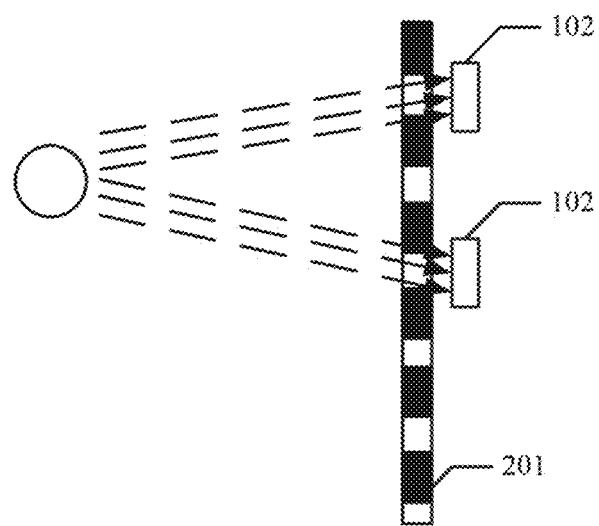
FIG. 8 is a schematic diagram of picture taking by two cameras according to an embodiment of this application.

Manner 2: There may be alternatively at least two cameras 102. FIG. 8 is a schematic diagram of picture taking by two cameras. Positions of the two cameras behind a display are different, so shooting angles are different. Therefore, occluded areas in pictures taken by the two cameras are also different.

Optionally, when performing the step of processing the N pictures by using an image synthesis method, the processor 180 may specifically perform the following step:

processing the N pictures by complementing the occluded areas based on pictures taken by the at least two cameras.

In this way, a plurality of pictures with different occluded areas can also be obtained without the cameras moved, and a picture in which the occluded area is recovered can be obtained by processing.

A second processing method is picture data processing.

Optionally, the processor 180 may call an operation instruction stored in the memory 120 to perform the following operations:

taking a picture, where there is an occluded area resulting from occlusion by the non-transparent portion in the picture; and processing the picture by using an image processing algorithm, to obtain a picture in which the occluded area is recovered.

There are a plurality of specific manners to process the picture by using the image processing algorithm.

Manner 1: Optionally, when performing the step of processing the picture by using an image processing algorithm, the processor 180 may specifically perform the following step:

performing an interpolation operation on an occluded pixel in the picture by using information of adjacent pixels in the picture.

For example, a pixel in a picture is occluded, a pixel on the left side of the pixel is red, and a pixel on the right side is blue. Then, an interpolation operation may be performed. Pixel information obtained by synthesizing pixel information of the left and right sides of the pixel is used as information of the occluded pixel. It can be understood that the interpolation operation may alternatively be performed by synthesizing information of other adjacent pixels. This is not limited herein.

Manner 2: Optionally, when performing the step of processing the picture by using an image processing algorithm, the processor 180 may specifically perform the following steps:

recognizing physical information of an occluded pixel in the picture; and recovering information of the occluded pixel in the picture based on content of the recognized physical information.

Figure 9A:
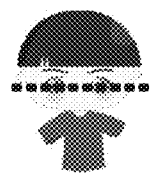
FIG. 9a is a schematic diagram of image processing according to an embodiment of this application.
Figure 9B:
FIG. 9b is another schematic diagram of image processing according to an embodiment of this application.

To understand this, refer to FIG. 9a and FIG. 9b. FIG. 9a shows a picture taken with an occluded area. The terminal can recognize physical information of occluded pixels in the picture, which is a portion of eyes in faces of a human and a portion of the faces. Therefore, information of the occluded pixels may be recovered based on general construction of eyes and faces, and finally a picture shown in FIG. 9b is obtained.

A third processing method is picture synthesis followed by picture data processing.

Optionally, the processor 180 may call an operation instruction stored in the memory 120 to perform the following operations:

when calling the camera 102 for shooting, instructing the camera 102 to quickly take N pictures at different positions, where, in each of the pictures, there is an occluded area resulting from occlusion by the non-transparent portion, and N is a positive integer greater than 1;

processing the N pictures by using an image synthesis method, to obtain a picture in which the occluded area is partially recovered;

obtaining a picture, where there is an occluded area resulting from occlusion by the non-transparent portion in the picture; and processing the picture by using an image processing algorithm, to obtain a picture in which the occluded area is recovered.

A specific way of obtaining a plurality of pictures with different occluded areas and a specific way of processing the pictures by using an image processing algorithm are similar to those in the first processing method and the second processing method, and are not further described herein.

It can be understood that data processing may be performed on the pictures before the pictures are synthesized to obtain a picture in which the occluded area is recovered, or the foregoing processing methods may be combined in other manners. This is not limited herein.

In the foregoing embodiment, the occluded area resulting from occlusion by the non-transparent portion in the picture taken can be recovered in different ways. Further, the proportion of the transparent portion in the first area 206 is made greater than the proportion of the transparent portion in the second area by changing a pixel structure or a pixel design. In this way, the occluded area in the picture taken is reduced in quantity or size.

Two methods for increasing the proportion of the transparent portion in the first area 206 are described below.

Method 1: reducing a quantity of pixels per inch (pixels per inch, PPI).

Optionally, a pixel design is changed, so that the PPI of the first area 206 is 1/M of the PPI of the second area, where M is greater than 1.

Figure 10:
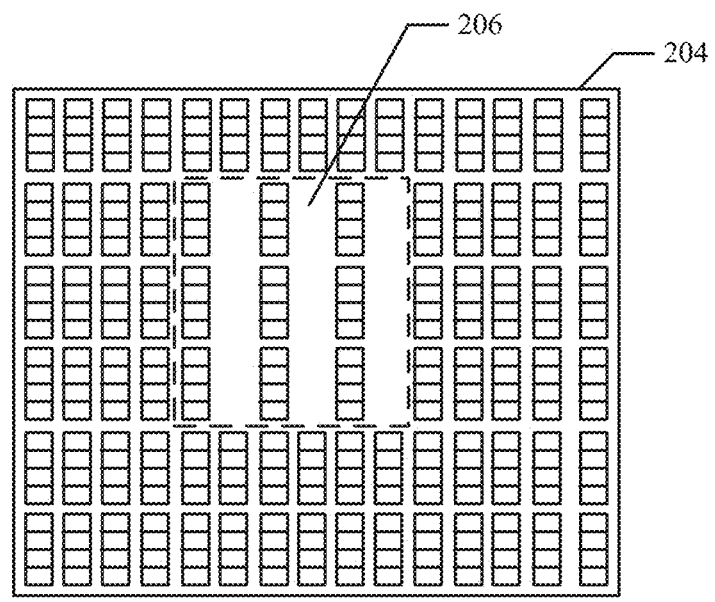
FIG. 10 is a schematic diagram of reducing a quantity of pixels per inch according to an embodiment of this application.

To understand this, refer to FIG. 10. As shown in FIG. 10, the PPI of the first area is reduced to ½ of the PPI of the second area, that is, the pixel units of the first area 206 are reduced by half. Therefore, transparent portions between the pixel units in the first area are greatly increased. It should be noted that FIG. 10 is merely a schematic diagram of PPI reduction. In practical application, generally, three adjacent RGB pixels are removed to ensure normal display of an image.

Optionally, after the PPI of the first area 206 is reduced, the pixel units in the first area that can display data are correspondingly reduced relative to the second area. To ensure a display effect of the image, the processor 180 may further perform the following step:

compressing display data of M adjacent pixels in the first area 206 into display data of one pixel for display.

Figure 11:
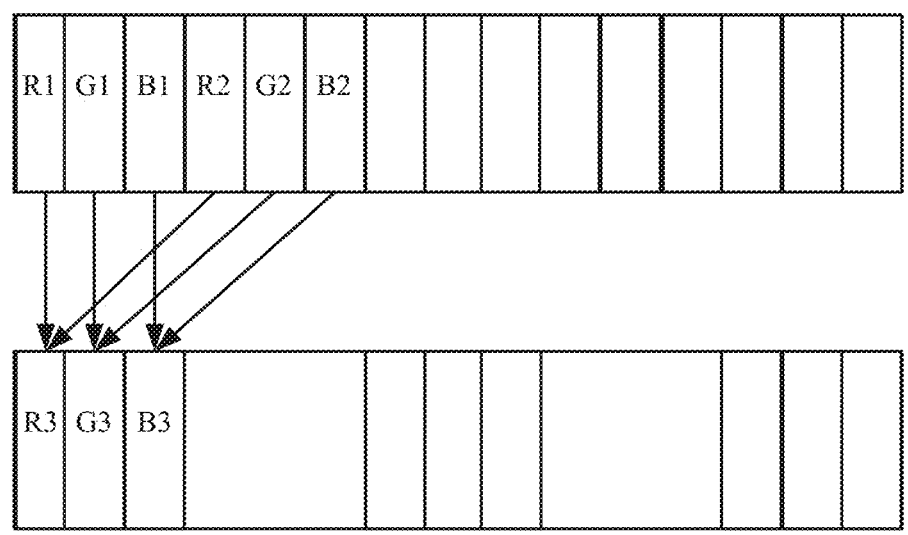
FIG. 11 is a schematic diagram of compressing display data according to an embodiment of this application.

It can be understood that a ratio of display data compression changes in accordance with a ratio of PPI reduction. As shown in FIG. 11, for example, the PPI of the first area 206 is ½ of a PPI of another area. Therefore, display data of six pixels in a to-be-displayed image needs to be compressed into three corresponding pixel units of the first area 206, where display data of the R color in the six pixels of the to-be-displayed image is R1 and R2; display data of the G color is G1 and G2; and display data of the B color is B1 and B2. In this case, the display data R3, G3, and B3 of the three corresponding pixel units of the first area 206 can be obtained through calculations R3=(R1+R2)/2, G3=(G1+G2)/2, and B3=(B1+B2)/2.

Optionally, after the PPI of the first area 206 is reduced, the entire first area 206 turns darker relative to the second area. To enhance a display effect of the image, the processor 180 may further perform the following step:

increasing overall brightness of the first area 206 so that a similarity between brightness curves of the first area and the second area is greater than a preset value.

Specifically, the processor 180 may instruct the display panel 101 to properly adjust a width-to-length ratio of a DTFT of pixels (control an Ipixel-Vdata curve) of the first area 206, to increase output current of pixels under a same Vdata and proportionally increase the overall brightness of the first area, so that the similarity between the brightness curves of the first area 206 and the second area in the pixel area 204 is greater than the preset value.

It can be understood that the overall brightness of the first area 206 may alternatively be increased in other ways, for example, using external compensation to perform more precise regulation, or making correction to increase brightness of colors of the display data when the display data is compressed. This is not limited herein.

Method 2: changing a circuit structure.

Optionally, a pixel circuit different from that in the second area is used in the first area 206. It can be understood that components of the pixel circuit used in the first area 206 are fewer than components of the pixel circuit used in the second area. Because the pixel circuit is simplified, quantities of devices and connecting wires are reduced. Therefore, more transparent portions are obtained for the camera.

There are a plurality of specific ways to simplify the pixel circuit, one of which is described below as an example. A pixel circuit without internal compensation is used in the first area.

Figure 12:
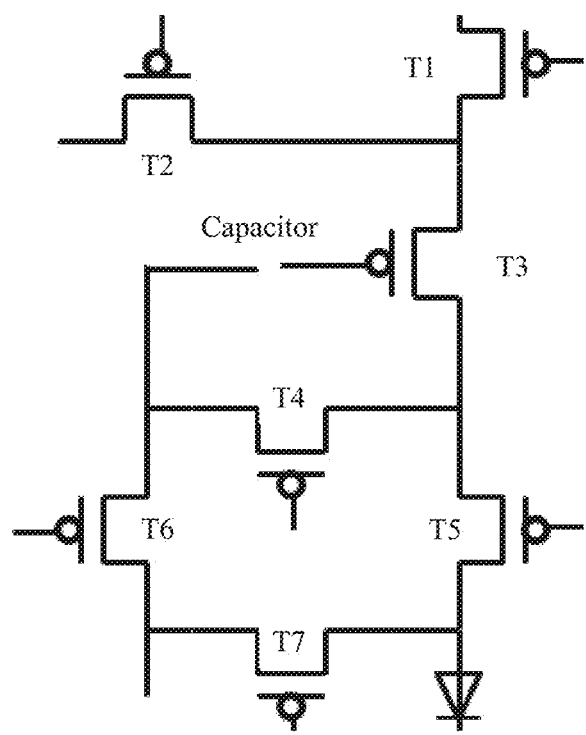
FIG. 12 is a schematic structural diagram of a 7T1C circuit according to an embodiment of this application.

It should be noted that, typically, a pixel circuit with internal compensation, for example, a 7T1C circuit or a circuit with more thin film transistors, is used in the pixel area 204 of the display panel 101. A specific circuit structure of a 7T1C circuit is shown in FIG. 12. That is, seven thin film transistors (Thin Film Transistor, TFT) and one capacitor drive one pixel unit, where T1 to T7 are the seven TFTs in the circuit.

Figure 13:
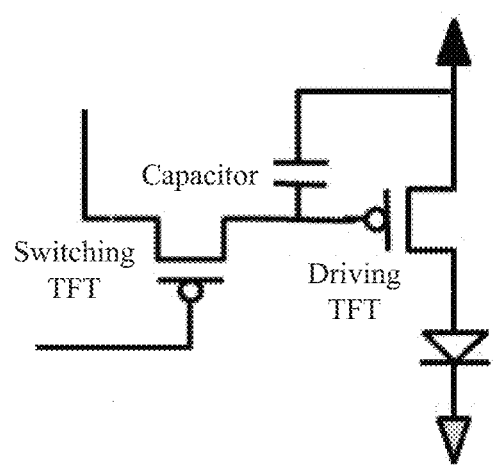
FIG. 13 is a schematic structural diagram of a 2T1C circuit according to an embodiment of this application.

By contrast, a pixel circuit without internal compensation is typically a 2T1C circuit. A specific circuit structure is shown in FIG. 13. That is, two thin film transistors and one capacitor drive one pixel unit, where a switching TFT and a driving TFT are the two TFTs in the circuit.

Using a pixel circuit without internal compensation in the first area, for example, using a 2T1C circuit, simplifies a structure of the pixel circuit and reduces the quantities of devices and connecting wires, increasing the proportion of the transparent portion of the first area 206.

Optionally, because a pixel circuit without internal compensation is used in the first area 206, there may be chromatic aberration compared with display of the second area. Therefore, the processor 180 may be further configured to perform the following step:

performing external compensation on the pixel units of the first area 206.

Specifically, main operation steps of the external compensation are as follows:

1. Grab display brightness and colors of a 2T1C area in each gray scale and color state of the display panel;
2. Calculate a deviation of brightness displayed by each small area or each point from an ideal value;
3. Calculate, based on the deviation, correction required for a data voltage of each pixel in the 2T1C area in this display state; and
4. Write the correction as a lookup table into an integrated circuit (integrated circuit, IC), where in actual display, the IC selects a correction amount based on different conditions, and superposes the correction amount onto an output Gamma voltage.

The chromatic aberration between the first area and the second area is corrected by externally compensating the pixel units of the first area 206. In this way, a relatively good display effect can be obtained even with a simplified pixel circuit.

In the foregoing embodiment, the proportion of the transparent portion in the first area 206 is increased in different ways. Further, when the camera performs shooting, light emitted by the display panel in front of the camera may interfere with shooting quality. To avoid this interference, a black frame may be inserted during the shooting.

Optionally, the processor 180 is further configured to perform the following step:

inserting a black frame into the display panel when the camera is called for shooting.

Further, in order to ensure correct timing for inserting the black frame, when performing the step of inserting a black frame into the display panel when the camera is called for shooting, the processor 180 may specifically perform the following steps:

starting a black frame insertion operation when a shooting instruction is received;

instructing the camera to start shooting when it is determined that the black frame insertion operation is completed; and recovering a screen when a shooting completion instruction is received.

It can be understood that the black frame may be a full-screen black frame, or a black frame that turns the first area 206 into be a black screen. This is not limited herein.

It should be noted that a response time of the display panel s extremely short, in microseconds, and typical exposure duration of a current camera is less than duration of one frame. Therefore, only synchronization of camera image acquisition and black frame refresh is required to ensure screen display and avoid affecting shooting.

The terminal provided with a camera in the embodiments of this application is described above. A shooting method in the embodiments of this application is described below. It can be understood that the shooting method is based on the foregoing terminal provided with a camera in the embodiments of this application. The terminal includes a display panel 101 and at least one camera 102. The at least one camera 102 is located behind the display panel 101, an area corresponding to a position of the at least one camera 102 on the display panel 101 is a first area 206, and an area other than the first area 206 on the display panel 101 is a second area. Each pixel unit 301 of the first area 206 includes a transparent portion 302 and a non-transparent portion 303, each pixel unit of the second area includes a transparent portion and a non-transparent portion, and a proportion of the transparent portion in the first area is greater than a proportion of the transparent portion in the second area. It can be understood that there are two specific ways to make the proportion of the transparent portion in the first area greater than the proportion of the transparent portion in the second area. One is to reduce a PPI of the first area, and the other is to simplify a pixel structure design of the first area. The following describes the shooting method in these two cases.

1. Reduce the PPI of the first area to make the proportion of the transparent portion in the first area greater than the proportion of the transparent portion in the second area.

Figure 14:
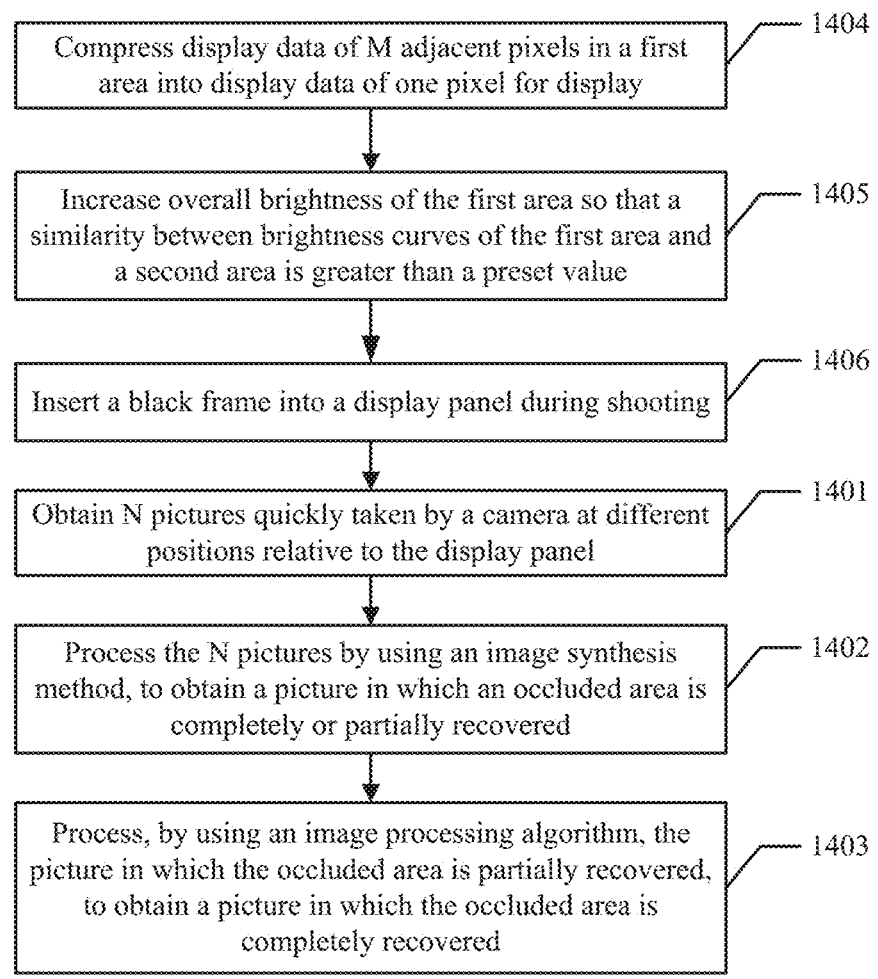
FIG. 14 is a schematic flowchart of a shooting method according to an embodiment of this application.

FIG. 14 shows an embodiment of the shooting method in the embodiments of this application.

1401: Obtain N pictures quickly taken by the camera at different positions relative to the display panel.

It should be noted that, in each of the N pictures, there is an occluded area resulting from occlusion by the non-transparent portion in the first area, and N is a positive integer greater than 1.

It can be understood that there are different ways to obtain the N pictures. For example, the terminal may include a micro-motor; the micro-motor drives the at least one camera to move during shooting; and during movement of the at least one camera, the terminal may control the at least one camera to quickly take the N pictures at different positions relative to the display panel. Alternatively, the terminal is provided with at least two cameras at different positions, in which case the N pictures can be obtained when the at least two cameras perform shooting.

1402: Process the N pictures by using an image synthesis method, to obtain a picture in which the occluded area is completely or partially recovered.

It can be understood that a specific method for performing image synthesis processing on the N pictures may differ depending on a manner of obtaining the N pictures. If the N pictures are taken during movement of at least one camera driven by the micro-motor, the N pictures may be processed based on positions of the camera relative to the display panel when the at least one camera moves; if the N pictures are taken by at least two cameras at different positions, the N pictures may be processed by complementing the occluded areas based on pictures taken by the at least two cameras.

It should be noted that by processing the obtained N pictures using the image synthesis method, a picture in which the occluded area is completely recovered can be obtained, as shown in FIG. 5. It is also possible that a processed picture should still include some occluded areas. That is, a picture in which the occluded area is partially recovered is obtained.

1403: Process, by using an image processing algorithm, the picture in which the occluded area is partially recovered, to obtain a picture in which the occluded area is completely recovered.

For the obtained picture in which the occluded area is partially recovered, the image processing algorithm may be used to process the picture to obtain a picture in which the occluded area is completely recovered.

There are a plurality of ways to process, by using an image processing algorithm, the picture in which the occluded area is partially recovered.

An interpolation operation may be performed, by using information of adjacent pixels of an occluded pixel, on the occluded pixel in the picture in which the occluded area is partially recovered. For example, a pixel in a picture is occluded, a pixel on the left side of the pixel is red, and a pixel on the right side is blue. Then, an interpolation operation may be performed. Pixel information obtained by synthesizing pixel information of the left and right sides of the pixel is used as information of the occluded pixel. It can be understood that the interpolation operation may alternatively be performed by synthesizing information of other adjacent pixels. This is not limited herein.

Alternatively, physical information of an occluded pixel in the picture in which the occluded area is partially recovered may be recognized; and information of the occluded pixel in the picture in which the occluded area is partially recovered is recovered based on content of the recognized physical information. For example, FIG. 9*a* is a picture with an occluded area. The terminal can recognize physical information of occluded pixels, which is a portion of eyes in faces of a human and a portion of the faces. Therefore, information of the occluded pixels may be recovered based on general construction of eyes and faces, and finally a picture shown in FIG. 9*b* is obtained.

It can be understood that steps 1401 to 1403 may be performed when the terminal performs shooting. Step 1403 is performed only when the picture obtained in step 1402 is a picture in which the occluded area is partially recovered, or else it may not be performed.

1404: Compress display data of M adjacent pixels in the first area into display data of one pixel for display.

It should be noted that, after the PPI of the first area is reduced, the pixel units of the first area are reduced. If the PPI of the first area is reduced to 1/M of the PPI of the second area, the pixel units of the first area are also reduced to 1/M of those of the second area. To understand this, refer to FIG. 10. As shown in FIG. 10, the PPI of the first area is reduced to ½ of the PPI of the second area, that is, the pixel units of the first area 206 are reduced by half. Therefore, transparent portions between the pixel units in the first area are greatly increased. It should be noted that FIG. 10 is merely a schematic diagram of PPI reduction. In practical application, generally, three adjacent RGB pixels are removed to ensure normal display of an image.

Therefore, after the PPI is reduced, a ratio of display data compression changes in accordance with a ratio of PPI reduction. As shown in FIG. 11, for example, the PPI of the first area 206 is ½ of a PPI of another area. Therefore, display data of six pixels in a to-be-displayed image needs to be compressed into three corresponding pixel units of the first area 206, where display data of the R color in the six pixels of the to-be-displayed image is R1 and R2; display data of the G color is G1 and G2; and display data of the B color is B1 and B2. In this case, the display data R3, G3, and B3 of the three corresponding pixel units of the first area 206 can be obtained through calculations R3=(R1+R2)/2, G3=(G1+G2)/2, and B3=(B1+B2)/2.

1405: Increase overall brightness of the first area so that a similarity between brightness curves of the first area and the second area is greater than a preset value.

It should be noted that, after the PPI of the first area 206 is reduced, because light emitting pixel units are reduced, the entire first area 206 becomes darker relative to the second area. Therefore, step 1405 may be performed to enhance a display effect of the image.

There are a plurality of specific ways to increase the overall brightness of the first area. For example, one possible way is to properly adjust a width-to-length ratio of a DTFT of pixels (control an Ipixel-Vdata curve) of the first area 206, to increase output current of pixels under a same Vdata and proportionally increase the overall brightness of the first area so that the similarity between the brightness curves of the first area 206 and the second area in the pixel area 204 is greater than the preset value. Alternatively, more precise regulation may be performed using external compensation, or correction is made to increase brightness of colors of the display data when the display data is compressed. This is not limited herein.

It can be understood that steps 1404 and 1405 may be performed when the terminal is powered on, or may be hardwired into a system. This is not limited herein.

1406: Insert a black frame into the display panel during shooting.

It can be understood that the camera is placed behind the display panel, and external light is acquired through the transparent portion of the display panel for photosensitive shooting, so light emitted by the first area of the display panel located in front of the camera affects external light acquisition of the camera. Therefore, to obtain a better shooting effect, a black frame may be inserted into the display panel during shooting.

To ensure consistent timing of black frame insertion and shooting, shooting and black frame insertion may be controlled to be time-synchronized. For example, the following steps may be performed: starting a black frame insertion operation when a shooting instruction is received; starting shooting when it is determined that the black frame insertion operation is completed; and recovering a screen when a shooting completion instruction is received.

It can be understood that this step is for avoiding impact on acquisition of external light by light emitted by the first area during shooting. Therefore, the black frame may be merely a black frame that turns the first area into a black screen, or may be a full-screen black frame. This is not limited herein.

In this embodiment of this application, the PPI of the first area is reduced so that the proportion of the transparent portion in the first area is greater than the proportion of the transparent portion in the second area, ensuring normal shooting of the camera and implementing integration of a front-facing camera into a display area without affecting an industrial design effect and overall display of the screen. Using the image synthesis method to process the N pictures obtained ensures integrity of the pictures taken. If the synthesized picture is a picture in which the occluded area is partially recovered, the picture may further be processed by using the image processing algorithm, to obtain a picture in which the occluded area is completely recovered, thereby further ensuring a picture effect. Moreover, display data of M adjacent pixels in the first area is compressed into display data of one pixel for display and overall brightness of the first area is increased. In this way, an effect of a picture taken is ensured, and the display panel is enabled to display an image without being affected, obtaining a relatively good display effect. During shooting, a black frame is inserted into the display panel to avoid impact on the shooting effect by the light emitted by the first area, thereby improving shooting quality.

2. Simplify a pixel structure to make the proportion of the transparent portion in the first area greater than the proportion of the transparent portion in the second area.

It can be understood that the pixel structure may be simplified by using a pixel circuit without internal compensation, such as a 2T1C circuit, in the first area, and using a pixel circuit with internal compensation, such as a 7T1C circuit, in the second area.

Figure 15:
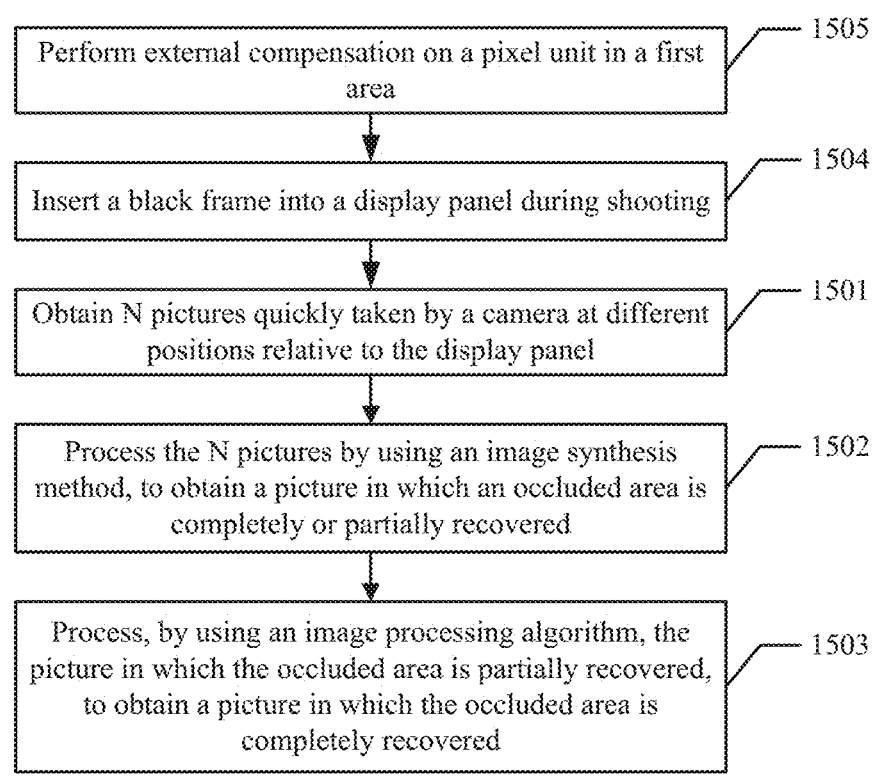
FIG. 15 is another schematic flowchart of a shooting method according to an embodiment of this application.

FIG. 15 shows another embodiment of the shooting method in the embodiments of this application.

1501: Obtain N pictures quickly taken by the camera at different positions relative to the display panel.

1502: Process the N pictures by using an image synthesis method, to obtain a picture in which the occluded area is completely or partially recovered.

1503: Process, by using an image processing algorithm, the picture in which the occluded area is partially recovered, to obtain a picture in which the occluded area is recovered.

Steps 1501 to 1503 are similar to steps 1401 to 1403, and are not further described herein.

1504: Insert a black frame into the display panel during shooting.

Step 1504 is similar to step 1406, and is not further described herein.

1505: Perform external compensation on the pixel units of the first area.

It can be understood that, after the pixel circuit without internal compensation is used in the first area, chromatic aberration between the first area and the second area may occur because of different pixel circuit structures. Therefore, the pixel units of the first area may be externally compensated. Specifically, main steps of the external compensation operation are as follows:

1. Grab display brightness and colors of a 2T1C area in each gray scale and color state of the display panel;

2. Calculate a deviation of brightness displayed by each small area or each point from an ideal value;

3. Calculate, based on the deviation, correction required for a data voltage of each pixel in the 2T1C area in this display state; and 4. Write the correction as a lookup table into an integrated circuit (integrated circuit, IC), where in actual display, the IC selects a correction amount based on different conditions, and superposes the correction amount onto an output Gamma voltage.

The chromatic aberration between the first area and the second area is corrected by externally compensating the pixel units of the first area 206. In this way, a relatively good display effect can be obtained even with a simplified pixel circuit.

In this embodiment of this application, a structure of the pixel unit in the first area is simplified so that the proportion of the transparent portion in the first area is greater than the proportion of the transparent portion in the second area. This ensures normal shooting of the camera and implements integration of a front-facing camera into a display area without affecting an industrial design effect and overall display of the screen.

It can be understood that the foregoing two manners making the proportion of the transparent portion in the first area greater than the proportion of the transparent portion in the second area are merely examples. In practical application, other manners, for example, a combination of the foregoing two manners, may be used to make the proportion of the transparent portion in the first area greater than the proportion of the transparent portion in the second area. This is not limited herein.

In the specification, claims, and accompanying drawings of this application, the terms "first", "second", "third", "fourth", and the like (if existent) are intended to distinguish between similar objects but do not necessarily indicate a specific order or sequence. It should be understood that the data termed in such a way are interchangeable in appropriate circumstances, so that the embodiments described herein can be implemented in other orders than the order illustrated or described herein. Moreover, the terms "comprise", "provided with" and any other variants thereof mean to cover the non-exclusive inclusion. For example, a process, method, system, product, or device that includes a list of steps or units is not necessarily limited to those steps or units, but may include other steps or units not expressly listed or inherent to such a process, method, system, product, or device.

What is claimed is:

1. A terminal, comprising:
    a display panel comprising:
        a first area comprising first pixel units, wherein the first pixel units comprise first transparent portions and first non-transparent portions; and
        a second area comprising second pixel units, wherein the second pixel units comprise second transparent portions and second non-transparent portions, and wherein a proportion of the first transparent portions in the first area is greater than a proportion of the second transparent portions in the second area;
    two front cameras located behind the display panel, wherein the first area corresponds to a position corresponding to the two front cameras, and wherein the two front cameras are configured to take pictures comprising occluded areas resulting from occlusion by the first non-transparent portions; and
    a processor coupled to the display panel and the two front cameras and configured to:
        obtain the pictures from the two front cameras; and
        process the pictures by complementing the occluded areas based on the pictures to obtain a picture in which the occluded areas are completely or partially recovered.

2. The terminal according to claim 1, wherein the first transparent portions or the second transparent portions comprise transparent glass or a transparent plastic film, and wherein the first non-transparent portions or the second non-transparent portions comprise a thin film transistor and a metal wire in each first pixel unit or second pixel unit.

3. The terminal according to claim 1, wherein a quantity of pixels per inch (PPI) of the first area is 1/M of a PPI of the second area, and wherein M is greater than 1.

4. The terminal according to claim 1, wherein the first area comprises a pixel circuit without internal compensation, and wherein the second area comprises a pixel circuit with internal compensation.

5. The terminal according to claim 1, wherein the processor is further configured to perform an interpolation operation on an occluded pixel in the picture using information of adjacent pixels of the occluded pixel.

6. The terminal according to claim 1, wherein the processor is further configured to:
    recognize physical information of an occluded pixel in the picture; and
    recover information of the occluded pixel in the picture based on content of the physical information.

7. The terminal according to claim 1, wherein the processor is further configured to increase an overall brightness of the first area so that a similarity between brightness curves of the first area and the second area is greater than a preset value.

8. The terminal according to claim 1, wherein the processor is further configured to insert a black frame into the display panel during shooting.

9. A shooting method implemented by a terminal, wherein the method comprises:
    obtaining pictures taken by at least two cameras of the terminal that are located behind a display panel of the terminal, wherein the pictures comprise occluded areas resulting from occlusion by first non-transparent portions of a first area of the display panel that corresponds to a position of the at least two cameras, wherein the first area comprises first pixel units that comprise first transparent portions and the first non-transparent portions, wherein a second area of the display panel comprises second pixel units comprising second transparent portions and second non-transparent portions, and wherein a proportion of the first transparent portions in the first area is greater than a proportion of the second transparent portions in the second area; and
    processing the pictures by complementing the occluded areas based on the pictures to obtain a first picture in which the occluded areas are completely or partially recovered.

10. The shooting method according to claim 9, wherein when the occluded areas are partially recovered in the first picture, the method further comprises processing, using an image processing algorithm, the first picture to obtain a second picture in which the occluded areas are completely recovered.

11. The shooting method according to claim 10, wherein processing the first picture comprises performing an interpolation operation on an occluded pixel in the first picture using information of adjacent pixels of the occluded pixel.

12. The shooting method according to claim 10, wherein processing the first picture comprises:
    recognizing physical information of an occluded pixel in the first picture; and
    recovering information of the occluded pixel in the first picture based on content of the physical information.

13. The shooting method according to claim 9, wherein a pixels per inch (PPI) of the first area is 1/M of a PPI of the second area, wherein M is greater than 1, and wherein the method further comprises compressing display data of M adjacent pixels in the first area into display data of one pixel for display.

14. The shooting method according to claim 13, wherein the method further comprises increasing overall brightness of the first area so that a similarity between brightness curves of the first area and the second area is greater than a preset value.

15. The shooting method according to claim 9, wherein the first area comprises a pixel circuit without internal compensation, and wherein the method further comprises performing external compensation on the first pixel units.

16. The shooting method according to claim 9, wherein the method further comprises inserting a black frame into the display panel during shooting.

17. A computer program product comprising computer-executable instructions stored on a non-transitory computer-readable medium that, when executed by a processor, cause a terminal to:
obtain pictures taken by at least two cameras of the terminal that are located behind a display panel of the terminal, wherein the pictures comprise occluded areas resulting from occlusion by first non-transparent portions of a first area of the display panel that corresponds to a position of the at least two cameras, wherein the first area comprises first pixel units that comprise first transparent portions and the first non-transparent portions, wherein a second area of the display panel comprises second pixel units comprising second transparent portions and second non-transparent portions, and wherein a proportion of the first transparent portions in the first area is greater than a proportion of the second transparent portions in the second area; and
process the pictures by complementing the occluded areas based on the pictures to obtain a first picture in which the occluded areas are completely or partially recovered.

18. The computer program product of claim 17, wherein when the occluded areas are partially recovered in the first picture, the computer-executable instructions further cause the terminal to process, using an image processing algorithm, the first picture to obtain a second picture in which the occluded areas are completely recovered.

19. The computer program product of claim 18, wherein the computer-executable instructions further cause the terminal to process the first picture by causing the terminal to perform an interpolation operation on an occluded pixel in the first picture using information of adjacent pixels of the occluded pixel.

20. The computer program product of claim 18, wherein the computer-executable instructions further cause the terminal to process the first picture by causing the terminal to:
recognize physical information of an occluded pixel in the first picture; and
recover information of the occluded pixel in the first picture based on content of the physical information.

* * * * *

UNITED STATES PATENT AND TRADEMARK OFFICE
CERTIFICATE OF CORRECTION

PATENT NO. : 11,082,547 B2
APPLICATION NO. : 16/629237
DATED : August 3, 2021
INVENTOR(S) : Gang Xu et al.

Page 1 of 1

It is certified that error appears in the above-identified patent and that said Letters Patent is hereby corrected as shown below:

On the Title Page

Item [56], delete "2011/0298953 A1 12/2011 Makamura" and insert --2011/0298953 A1 12/2011 Nakamura--

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*